METHOD OF FABRICATING SEMICONDUCTOR DEVICES

Filed July 9, 1968

INVENTOR
LAWRENCE K. BAKER

BY [signature]
ATTORNEY

United States Patent Office 3,535,774
Patented Oct. 27, 1970

3,535,774
METHOD OF FABRICATING SEMICONDUCTOR DEVICES

Lawrence K. Baker, Clinton, N.J., assignor to RCA Corporation, a corporation of Delaware Filed July 9, 1968, Ser. No. 743,540
Int. Cl. B01j *17/00;* H01l *5/00*
U.S. Cl. 29—580 3 Claims

ABSTRACT OF THE DISCLOSURE

In the fabrication of "edge passivated" semi-conductor devices having thin base layers, a conductivity modifier is diffused to a shallow depth into each flat surface of a semiconductor wafer to provide three layers of alternating conductivity type having P–N junctions therebetween. A plurality of grooves are provided in the flat surfaces of the wafer to segment the wafer into a plurality of spaced device components. The grooves have a depth extending into the middle layer of the wafer, thereby intersecting the P–N junctions between adjacent layers and providing separate junctions for each component. The edges of the junctions of each component are exposed by the grooves. The conductivity modifiers are then diffused further into the wafer, thereby reducing the thickness of the middle layer. A junction passivating material is then deposited within the grooves to overcoat the junction edges.

BACKGROUND OF THE INVENTION

This invention relates to the fabrication of semiconductor devices.

Certain types of semiconductor devices, such as transistors, comprise a pellet of semiconductor material containing two or more P–N junctions which extend to surfaces of the pellet. For the purposes of providing uniform characteristics from device to device, and preventing changes in the device characteristics during the life of the devices, the edges of the junctions at the pellet surfaces are stabilized, or "passivated" by being overcoated with an insulating material, such as silicon oxide, glass, or the like.

According to one method of fabricating such "edge-passivated" pellets, a plurality of the device components are simultaneously formed on a disc-like wafer of semiconductor material, e.g., silicon, and the wafer then diced to provide the individual pellets. Starting with a wafer of one conductivity type, a conductivity type modifier is diffused into each of the flat surfaces of the wafer to provide three layers of alternating conductivity type within the wafer, adjacent layers having a P–N junction therebetween. A gridwork of orthogonal grooves is then etched into each flat surface of the wafer, the grooves in one surface overlying, i.e., being in registry with, the grooves in the other surface. The grooves segment the wafer into a plurality of separate components. Also, the grooves have a depth extending into the middle layer of the wafer, thereby intersecting the P–N junctions and providing junctions in each component having exposed edges. The exposed junction edges are then overcoated with one or more stabilizing or passivating insulating materials. Thereafter, the flat surfaces of each of the components are metallized, and the wafer is broken apart, along the grooves, to provide the individual device pellets.

Certain semiconductor devices, e.g., transistors, open-base symmetrical transistors, also known as "trigger diodes," or the like, require that the middle or "base" layer of the device pellet have a small thickness, e.g., less than 2 mils. Attempts to fabricate such thin base layer devices using the above-described process have been generally unsatisfactory since, in forming the grooves on opposite sides of the wafer with a sufficient depth to extend into the thin middle layer, only thin connecting webs or bridges are left between the components to hold the wafer together. The wafer is thus rendered extremely fragile and very susceptible to premature breakage upon subsequent processing of the wafer. This results in loss of product.

SUMMARY OF INVENTION

In the fabrication of "edge passivated" semi-conductor devices having thin base layers, a semiconductor wafer is provided which has outer layers of one type conductivity on opposite sides of a middle layer of the other type conductivity, P–N junctions thus being provided between adjacent layers. The middle layer is thicker than that desired in the finished device. A plurality of grooves having a depth greater than the thickness of the two outer layers are then provided in the two sides of the wafer to segment the wafer into a plurality of components, and to cut through the junctions to expose the edges of the junctions of each component. The thickness of the middle layer is then decreased. A junction passivating material is deposited over the exposed edges of the junctions.

DESCRIPTION OF A PREFERRED EMBODIMENT

Figures 1, 2, 3, 4, 5:
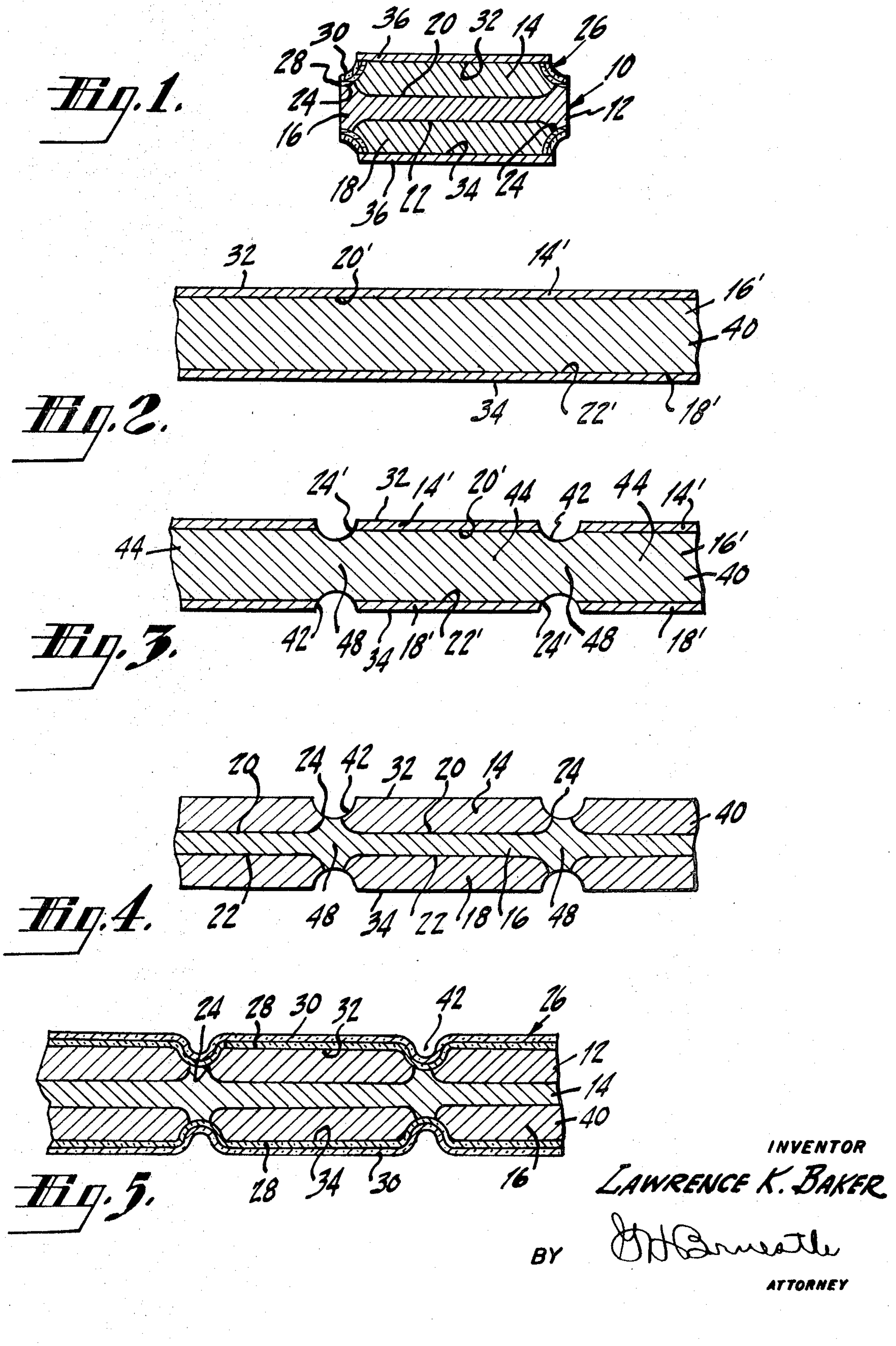
FIG. 1 is a side view, in section, of a semi-conductor pellet made in accordance with the present invention.
FIG. 2 is a side elevation, in section, of a portion of a semiconductor wafer, and illustrating one step in the fabrication of the pellet shown in FIG. 1.
FIGS. 3, 4, and 5 are views similar to that of FIG. 2 but showing successive steps in the fabrication of the pellet shown in FIG. 1.

With reference to FIG. 1, there is shown a semiconductor pellet 10 of a type having utility in a trigger diode of known type. The pellet 10 comprises a block 12 of silicon including a highly doped N conductivity type layer 14, a P conductivity type middle layer or "base" 16, and a highly doped N conductivity type middle layer or "base" 16, and a highly doped N conductivity type layer 18. Two P-N junctions 20 and 22 are present between the adjacent layers 14 and 16, and 16 and 18, respectively.

Each of the junctions 20 and 22 extends to the surface of the block 12. Overlying the edges 24 of the junctions 20 and 22 at the surface of the block 12 is a coating 26 of a passivating material. In this embodiment, the coating 26 comprises a first layer 28 of silicon oxide, and a second layer 30 of borosilicate glass.

The two flat surfaces 32 and 34 of the block 12 are coated with a layer 36 of metal, such as lead, to provide means whereby the pellet 10 can be mounted in a suitable enclosure and electrical connections made thereto, as known.

Fabrication of pellets of the type shown in FIG. 1 is as follows. Starting with a disc-like wafer of a semiconductor material, such as silicon, having the resistivity and conductivity type (e.g., P type) desired in the middle or base layer 16 of the finished pellet, an N type conductivity modifier, e.g., phosphorus, is diffused, in a known manner, into the flat surfaces 32 and 34 (FIG. 2) of a wafer 40. Three layers 14′, 16′ and 18′ or N, P and N conductivity type, respectively, and P-N junctions 20′ and 22′ between adjoining layers are thus provided. (A reference numeral system using primed numbers is used to designate those portions of the wafer 40 which, although differing somewhat in size or shape, are to become portions of the pellet 10 previously designated with unprimed reference numerals.) The phosphorus is diffused to only a shallow depth in the wafer 40, for a reason described below.

Alternatively, the three layer wafer comprising layers 14', 16', and 18' can be provided by epitaxially depositing outer layers 14' and 18' on a starting wafer corresponding to middle layer 16'.

A plurality of grooves 42 are then provided, as by sand plasting, etching, or the like, in each flat surface 32 and 34 of the wafer 40, as shown in FIG. 3, to segment the wafer 40 into a plurality of separate device components 44. Although not shown, the grooves 42 can be provided in a gridwork of orthogonal, intersecting lines. The grooves in each wafer surface 32 and 34 overlie one another. The grooves 42 have a depth to extend entirely through the layers 14' and 18' to intersect the junctions 20' and 22', thereby creating exposed junction edges 24' in each of the components 44.

Because of the shallow depth of the layers 14' and 18', at this point in the wafer processing procedure, the grooves 42 need have only a shallow depth to provide the exposed junction edges 24'. Thus, the webs or bridges 48 extending between the components 44 and holding the wafer 40 together can be of comparatively large thickness. In one embodiment, for example, the wafer 40 has a thickness of 6 mils, the layers 14' and 18' are diffused to a depth of 0.5 mil, the grooves 42 have a depth of 0.7 mil, and the webs 48 have a thickness of 5.3 mils. As a practical matter, it is found that webs 48 having a thickness generally in excess of 3 mils are preferred to prevent excessive premature breakage of the wafer.

The thickness of the layers 14' and 18' is then increased to the thickness desired of the layers 14 and 18 in the finished pellet 10 by driving the conductivity modifiers further into the wafer 40 in a second diffusion process. Means for doing this, e.g., heating the wafer 40, are known. The result of the second diffusion is shown in FIG. 4. The middle layer 16' is thus reduced to the thickness desired of the layer 16 in the pellet 10.

The depth of the grooves 42 is not increased, hence base layers 16 having as small a thickness as desired (within the accuracy of the diffusion processes) can be obtained without causing excessive weakening of the wafer 40, as in the prior art process.

During the second diffusion step, the junctions 20' and 22', and the exposed edges 24 thereof, are shifted to the positions they have in the finished pellet 10. This is shown in FIG. 4, unprimed reference numerals being used. Since the grooves 42 contain no conductivity modifier, the junction edges 24 are not driven into the body of the wafer 40, but still extend to the bottom of the grooves, and thus remain exposed.

The junction edges are then overcoated with a known passivating material. Alternatively, the passivating coating may be applied to the junction edges prior to the second diffusion step which serves to reduce the thickness of the midde layer 16' to the middle layer 16.

In the instant embodiment, a first layer 28 (FIG. 5) of silicon oxide is deposited on the wafer 40 and in the grooves 42 therein by known processes. One such process comprises decomposing silane gas ($SiH_4$) in oxygen in the presence of the wafer. Another process involves growing an oxide surface on the wafer by heating the wafer in steam. This later process involves heating the wafer to a temperature high enough to cause further diffusion of the conductivity modifier into the wafer, hence the aforementioned second diffusion step can be performed at the same time the oxide layer 28 is grown.

A layer 30 of glass, preferably having approximately the same coefficient of thermal expansion as that of silicon, to prevent cracking of the coating, e.g., a borosilicate glass, is then applied onto the layer 28. In one embodiment, the layer 28 has a thickness in the order ot 10,000 angstroms, and the layer 30 has a thickness in the order of 20,000 angstroms.

The use of various materials for passivating the exposed edges of junctions is known, and various ones of these materials can be used in the practice of the present invention.

The coating 26 is then stripped off the flat surfaces 32 and 34 of the components 44, as by sand blasting through a suitable mask, leaving the inside surfaces of the grooves 42 and the edges 24 of the junctions 20 and 22 coated. The flat surfaces 32 and 34 of the components 44 are then metallized, in known fashion, with lead over a plating of nickel. The wafer is then diced along the grooves 42, in known fashion, to provide the individual pellets 10.

What Is Claimed Is:

1. The method of fabricating a plurality of semiconductor devices comprising:

providing a three-layer semiconductor wafer in which the two outer layers are of one type conductivity and the middle layer is of opposite type conductivity and forms a pair of P–N junctions with said outer layers and in which said middle layer is thicker than that desired in the finished device;

forming grooves to a depth greater than the thickness of said outer layers in each of said sides to segment said wafer into a plurality of components;

thereafter decreasing the thickness of said middle layer;

depositing a junction passivating material over the exposed edges of said junctions; and dicing said wafer along said grooves into a plurality of individual ones of said components.

2. The method of claim 1 wherein the thickness decreasing step comprises heating the wafer to diffuse a conductivity modifier from said outer layers into said middle layer.

3. A method as in claim 1 wherein:

said outer layers are formed by diffusing a conductivity modifier into each of said opposite sides of a wafer of said opposite type conductivity; and the thickness decreasing step comprises heating the wafer to further diffuse said conductivity modifier into said wafer to a distance greater than the depth of said grooves.

References Cited

UNITED STATES PATENTS

| | | | |
|---|---|---|---|
| 3,163,916 | 1/1965 | Gault | 29—583 |
| 3,363,151 | 1/1968 | Chopra. | |
| 3,365,794 | 1/1968 | Botka | 29—580 |

JOHN F. CAMPBELL, Primary Examiner

W. TUPMAN, Assistant Examiner

U.S. Cl. X.R.

148—1.5